(12) United States Patent
Chen et al.

(10) Patent No.: US 6,632,372 B1
(45) Date of Patent: Oct. 14, 2003

(54) METHOD OF FORMING VIA-HOLES IN MULTILAYER CIRCUIT BOARDS

(75) Inventors: Man-Lin Chen, Miaoli Hsien (TW); Hsien-Kuang Lin, Taipei (TW); Chuang-Shin Chiou, Hsinchu Hsien (TW); Tien-Shou Shieh, Taipei (TW); Pey-Ching Liou, Miaoli (TW)

(73) Assignee: Industrial Technology Research Institute, Hsinchu (TW)

( * ) Notice: Subject to any disclaimer, the term of this patent is extended or adjusted under 35 U.S.C. 154(b) by 277 days.

(21) Appl. No.: 09/717,081

(22) Filed: Nov. 22, 2000

(30) Foreign Application Priority Data

Aug. 24, 2000 (TW) .......................................... 89117052

(51) Int. Cl.7 ............................................. H01B 13/00
(52) U.S. Cl. .............................. 216/13; 216/17; 216/18
(58) Field of Search ................. 174/264, 262, 174/255; 216/13, 17, 18, 19; 427/97; 257/700; 430/317

(56) References Cited

U.S. PATENT DOCUMENTS

| | | |
|---|---|---|
| 5,092,032 A | 3/1992 | Murakami |
| 5,200,026 A | 4/1993 | Okabe |
| 5,451,721 A | 9/1995 | Tsukada et al. |
| 5,914,216 A | 6/1999 | Amou et al. |
| 5,948,280 A | 9/1999 | Namgung |

*Primary Examiner*—Shrive P. Beck
*Assistant Examiner*—Roberts P Culbert
(74) *Attorney, Agent, or Firm*—Birch, Stewart, Kolasch & Birch, LLP

(57) ABSTRACT

The invention discloses a method of forming via-holes in multilayer circuit boards. The process includes forming covering substances in predetermined spots in a multilayer circuit board and thereafter applying an insulating layer upon the circuit board. The predetermined spots are then uncovered and the covering substances are removed to form via-holes.

20 Claims, 4 Drawing Sheets

METHOD OF FORMING VIA-HOLES IN MULTILAYER CIRCUIT BOARDS

BACKGROUND OF THE INVENTION

1. Field of the Invention

The invention relates to a method of manufacturing a multilayer circuit board, and more particularly to a method of forming via-holes in a multilayer circuit board.

2. Description of the Prior Art

Current market trends in the electronics industry are to decrease size and weight of circuit boards while increasing its speed, capability and interconnection density. The formation of via-holes in the interconnecting layers of multilayer circuit boards is a key factor in this development.

A number of advancements have been aimed at forming via-holes in the interconnecting layers of a multilayer circuit board by laser, photosensitive insulating layers or plasma drilling. For example, U.S. Pat. No. 5,948,280 discloses the use of not reinforced binders by laser or plasma drilling to form via-holes in multilayer circuit boards. In the case when a laser is used, via-holes are formed one by one, consequently its speed is relatively slow and is prone to residue problems. On the other hand, by way of plasma drilling, the process and the shapes of via-holes are hard to control.

Moreover, U.S. Pat. No. 5,914,216 teaches the usage of a photosensitive resin composition by a photolithographic technique to form via-holes. The photosensitive resin contains high exposing energy, therefore it is not user-friendly nor environmental-friendly. As for U.S. Pat. No. 5,451,721, photosensitive resin material is used for insulating layers. By photolithographic technique and conventional copper plating technique, high interconnection density is achieved. However, photosensitive material and solvents are necessary for the image development process, consequently pollution and safety issues will arise.

As for etching, U.S. Pat. No. 5,200,026 teaches the usage of the photo-imaging property of positive photoresists and by way of photolithographic technique to manufacture via bumps to interconnect upper layers and lower layers of circuit boards. However, it is hard to control the size of via bumps to achieve the required accuracy.

U.S. Pat. No. 5,092,032 discloses the structure of photoresist layers as a wiring layer and an electronically connected vias and the formation of a landless inner connection layer by via bumps. In this method, the via bumps are formed by plating, which is more suitable for connecting power source layer or ground layer. As a result, this is not ideal for signal transmitting.

SUMMARY OF THE INVENTION

The primary object of the invention is to provide a method for forming via-holes in multilayer circuit boards, wherein many via-holes can be formed simultaneously, hence the speed of forming via-holes is improved. Furthermore, the usage of material is not restricted.

To achieve the above-mentioned objects, the invention discloses a method for forming via-holes in multilayer circuit boards, comprising: forming covering substances at predetermined spots in a multilayer circuit board; applying an insulation layer upon the multilayer circuit board and thereafter uncovering the covering substances; and removing said covering substances to obtain via-holes.

According to the invention, via-holes are formed in one operation, consequently the speed is increased. Furthermore, the material is chosen from either photo-sensitive material or non photo-sensitive material, which allows more freedom in application

BRIEF DESCRIPTION OF THE DRAWINGS

The invention will become more fully understood from the detailed, description given hereinbelow and the accompanying drawings, given by way of illustration only and thus not intended to be limitative of the invention.

DETAILED DESCRIPTION OF THE INVENTION

The method of forming via-holes of the invention is comprised of the following steps: forming covering substances at predetermined spots in the multilayer circuit board; applying an insulation layer upon the multilayer circuit board, and thereafter uncovering the covering substances; and removing the covering substances to obtain via-holes. The method further includes curing and flattening of the insulation layer so that the covering substances are exposed.

Figure 3:
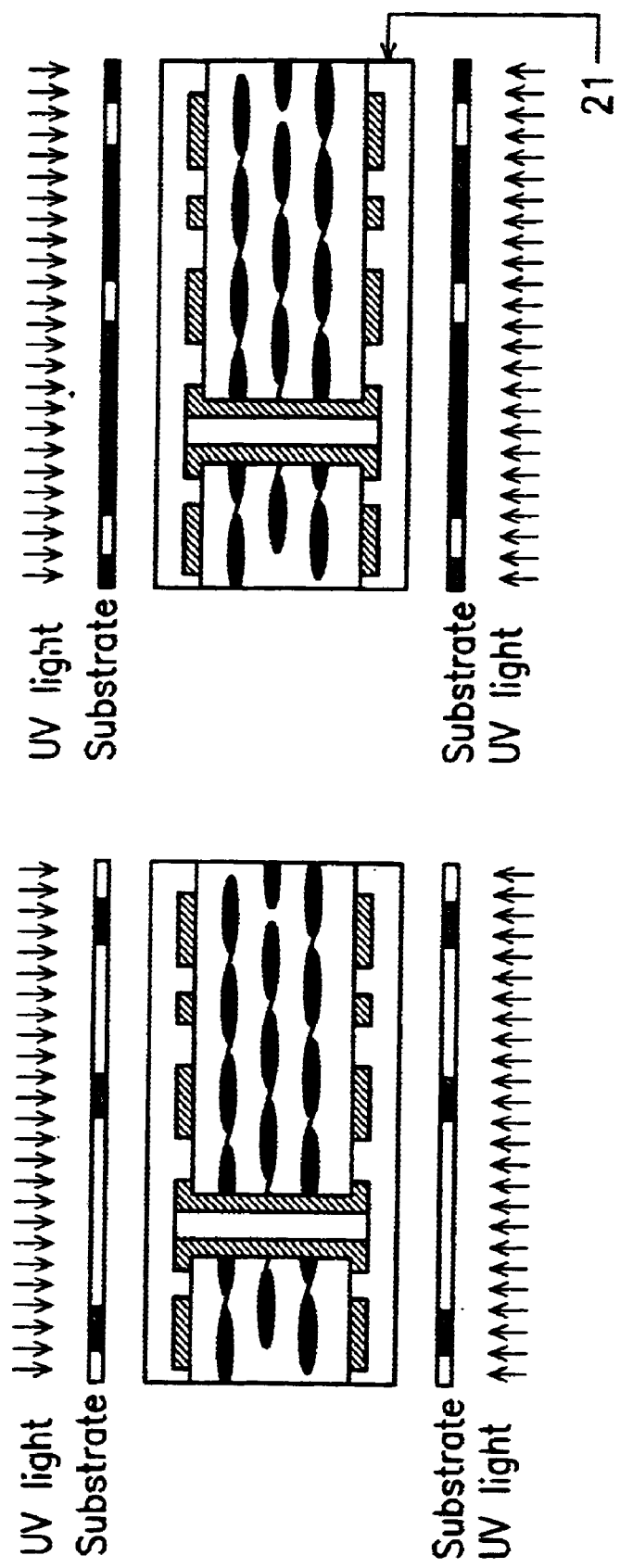

The covering substances are photoresist, and the method of forming the photoresist is by applying liquid photoresist coating or pressed photoresist films. The thickness of the photoresist is preferably 15~60 $\mu$m. The type of photoresist is either positive or negative photoresist (shown in FIG. 3).

If negative photoresist is used, its composition is:

(a) a polymer with a carboxylic group;
(b) a photo-initiator; and
(c) unsaturated photo monomer.

The development solution is preferably 0.5~3% sodium carbonate solution, and the stripping solution is preferably 1~10% sodium hydroxide solution.

The polymer with a carboxylic group is selected from the group consisting of a copolymer of alkyl(methyl)acrylate and (methyl)acrylate and a copolymer of alkyl(methyl) acrylate, (methyl)acrylic acid and a vinyl monomer copolymerizable with the alkyl(methyl)acrylate and (methyl) acrylate. Examples of alkyl(methyl)acrylate are, such as methyl(methyl)acrylate, ethyl(methyl)acrylate, butyl (methyl)acrylate and 2-ethylhexyl(methyl)acrylate. The vinyl monomers copolymerizable with the alkyl(methyl) acrylate or (methyl)acrylic acid include tetrahydrofurfuryl (methyl)acrylate, glycoldi(methyl)acrylate, (methyl) epoxyacrylate, 2,2,2-trifluoroethyl(methyl)acrylate, 2,2,3,3-tetraflluoropropyl(methyl)acrylate, acrylamide, diacetone acrylamide, and vinyltoluene. The polymer includes the homopolymers and copolyesters of the above compounds, for example, polyesters of terephthalic acid, isophthalic acid and sebacic acid, butadiene/acrylonitrile copolymer, cellulose acetate, cellulose acetate butyrate, methylcellulose and ethylcellulose.

There is no specific limitation for the photo-initiators. It is selected from benzil dimethyl ketal, 2,4-diethylthioxanthone, 2,4-isopropylthioxanthone, 2-methyl-1-(4-methylthio)phenyl)-2-morpholinopropanone-1 or benzophenone, etc. By incorporating with photo-sensitivity promotors, such as 2-dimethylaminoethyl benzoate, ethyl(p-dimethylamino)benzoate or Michler's ketone, a photo-sensitive solution with excellent photo-sensitivity is obtained.

Under UV exposure, the unsaturated photo monomer provides the photo-sensitive material with double bonds in the polymerization. The more double bonds that are present in a molecule, the higher the degree of chains is. A suitable unsaturated photo monomer is selected from trimethylolpropane triacrylate, pentaerythritol triacrylate, pentaerythritol tetraacrylate, dipentaerythritol pentacrylate, dipentaerythritol hexacrylate, bis-phenol A-type epoxy acrylate and urethane acrylate etc. The photo monomer can be used by itself or combined with more than 2 of the above monomers. The degree of hardness of the coatings can be adjusted by the species and amount of usage of the photo monomers. Optionally, heat-resistant agents, coloring agents and viscosity promoters can be added.

If a positive photoresist is used, its composition includes:

(a) an alkali-soluble resin;

(b) a quinonediazide group-containing compound.

The alkali-soluble resin is cresol resin, which is polymerized by cresol and formaldehyde. The compound contains a quinonediazide group and is a compound with a diazide group, for example, PR-12, PR-17 and PR-22 from the PCAS Company.

The development solution is 0.5~3% sodium hydroxide, sodium silicate, tetramethyl ammoniahydroxide solution. The stripping solution is 3~10% sodium hydroxide solution or made of organic solvents.

The liquid insulating layers are selected from photo-sensitive or non photo-sensitive materials and materials with or without solvents. Examples of such material are epoxy resin, bismaleimide triazine, polyimide and cyanate ester resins.

The method of applying the insulating layer is roller coating, screen coating or curtain coating. The curing step of the insulating layer is done by baking or exposing. In the step of baking or exposing, the resin can be non-solvent, B-stage (dried but not cured) or fully cured as solid. If it is fully cured, the following baking step is omitted. Thereafter, flattening is achieved by polishing or by using sandpaper/gauze. The specifications of the sandpaper/gauze may be chosen from #600, #1200 and #1600.

After the via-holes are formed, conventional methods are then employed to obtain an electrical connection. Build up of the multilayer circuit boards is done by further wiring processes. The conductive holes are formed by traditional wireless plating, plating, direct plating or insertion of conductive gel.

According to the invention, a method with low costs, high speed of forming via-holes, low exposure energy and easy detection of alignment between layers is achieved. Consequently, the product yield is raised.

The following example is intended to illustrate the invention more fully without limiting its scope, since numerous modifications and variations will be apparent to those skilled in this art.

Prefered Embodiment

A dry film of photoresist was made with the following ingredients:

| | |
|---|---|
| Acrylic binder (40% in MEK) | 250 g |
| Ethyl p-dimethylaminobenzoate | 0.5 g |
| Benzil dimethyl ketal | 2 g |
| PM4155 (Henkel Co.) | 45 g |
| Tricrecyl phosphate | 30 g |
| Benzotriazole | 0.2 g |
| p-Methoxy phenol | 0.2 g |

-continued

| | |
|---|---|
| Malechite green | 0.08 g |
| Acetone | 45 g |

Note: Acrylic binder was the copolymer of methacrylic acid, methyl methacrylate and buthyl methacrylate in a ratio of 0.34:0.30:0.36. The molecular weight was 40000~60000.

The photo-sensitive material was then mixed completely and was coated on a PE substrate by a coating machine. The substrate was then baked at 100° C. for 1.5 min to form a dry film. The thickness of the film was controlled at 50 $\mu$m.

A resin coating was prepared with the following ingredients:

| | |
|---|---|
| PKHH (Union Carbide) | 25 g |
| ECN1299 (Ciba Geigy) | 35 g |
| BromoEpoxy | 40 g |
| Dicy (dicyandiamide) | 10 g |
| SiO$_2$ | 60 g |
| PMA (propylene glycol monomethyl ether acetate) | 80 g |

The resin was mixed completely and polished with a three-roller machine to form a liquid resin.

Figure 1:
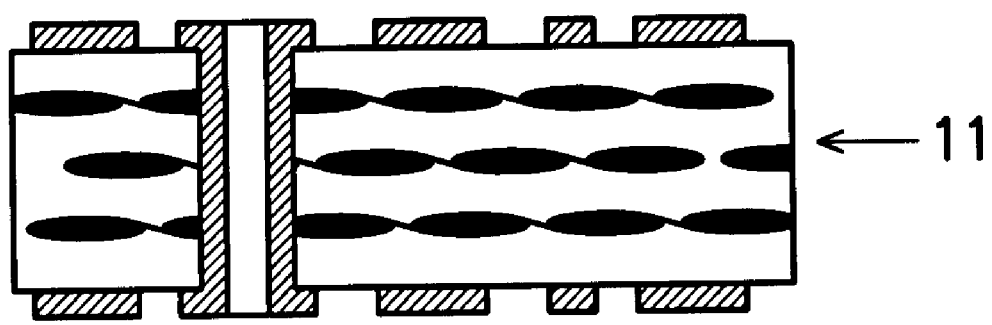
FIG. 1~9 show the steps of forming via-holes in a multilayer circuit board based on the method of the invention.
Figure 2:
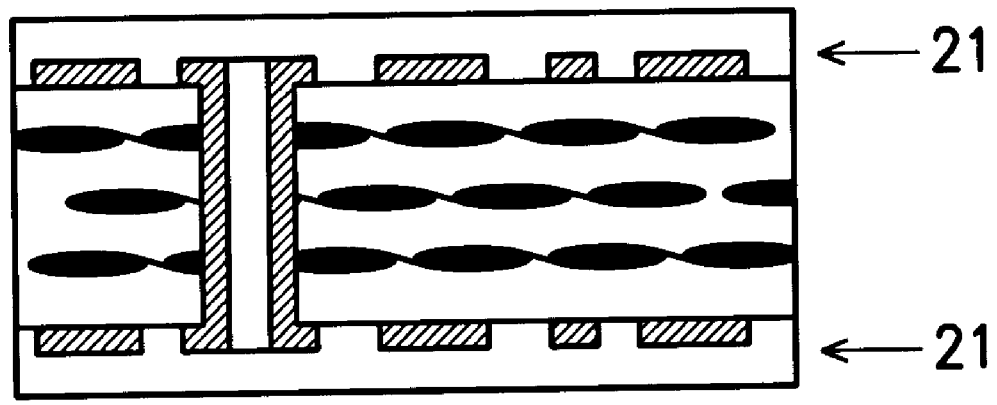
Figure 4:
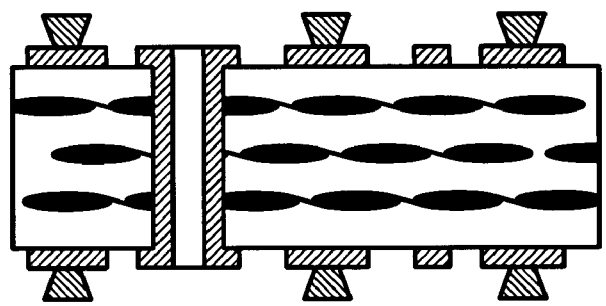
Figure 5:
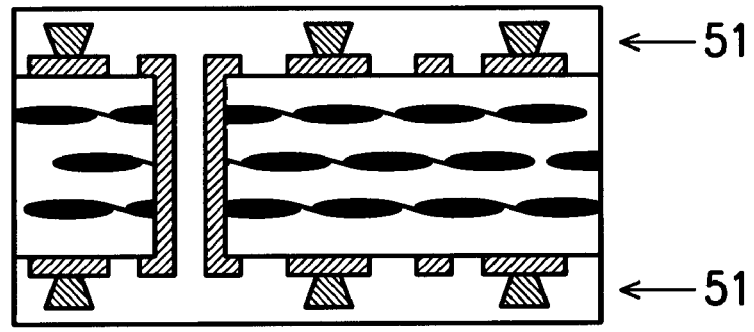
Figure 6:
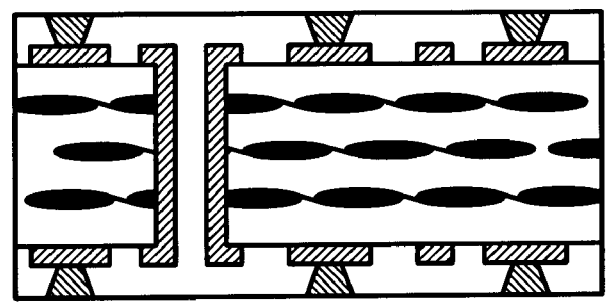
Figure 7:
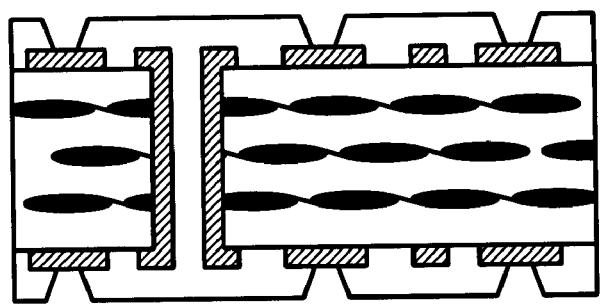
Figure 8:
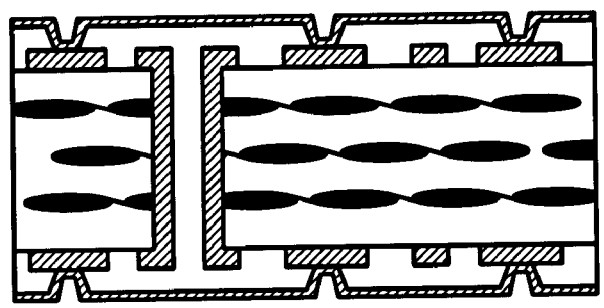
Figure 9:
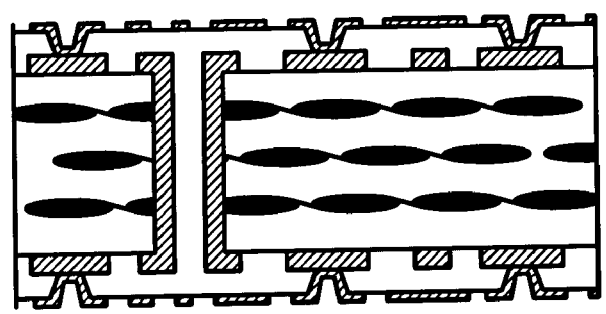

A wired substrate 11 (as shown in FIG. 1) was subjected to pretreatments, such as defat and acid-washing. Then a negative photoresist 21 was formed on the substrate (FIG. 2). The substrate was then exposed at 80 mJ/cm$^2$, using a film with holes of 2 mil~10 mil diameter in FIG. 3. After 15 minutes, the substrate was developed at 28° C. in 1% sodium carbonate solution to obtain a pattern, shown in FIG. 4. The substrate was then washed with acid, water, micro-etched, washed with water, acid and water and dried. Thereafter, the epoxy resin 51 was applied by roller coating on the substrate as shown in FIG. 5. The substrate was baked at 100° C. for 10 minutes to vaporize the solvent in the resin so that the resin is cured. In FIG. 6, #1200 sandpaper/gauge was used to polish the substrate to expose the photoresist, consequently a substrate with a thickness of 45 $\mu$m of resin was obtained. The photoresist of the substrate was stripped in 5% sodium hydroxide solution at 30° C. for 2~3 minutes, as shown in FIG. 7. Via-holes with a resolution of 2 mil were obtained. The substrate was then baked at 150° C. for an hour to cure. After steps of plating and wiring (in FIGS. 8 and 9), the build up of the substrate was completed. The above steps can be repeated to further build up the circuit board.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming via-holes in a multi-layer circuit board comprising:

forming a covering substance at predetermined spots on the multiplayer circuit board;

applying an insulating layer onto the multi-layer circuit board, and over the covering substance, and thereafter uncovering the covering substance;

and removing said covering substance to obtain via-holes.

2. The method as claimed in claim 1, wherein the covering substance is photoresist.

3. The method as claimed in claim 2, wherein the photoresist is applied as liquid coating or pressed as a dry film.

4. The method as claimed in claim 2, wherein the thickness of the photoresist is 15~60 μm.

5. The method as claimed in claim 2, wherein the type of photoresist is positive or negative photoresist.

6. The method as claimed in claim 1, wherein the insulating layer is liquid.

7. The method as claimed in claim 6, wherein the liquid insulating layer is selected from photo-sensitive material and non photo-sensitive material and with solvent or without solvent materials.

8. The method as claimed in claim 1, wherein the liquid insulating layer is applied by roller coating, screen coating or curtain coating.

9. The method as claimed in claim 1, wherein the step of uncovering the covering substance is by mechanical polishing or sandpaper/gauze polishing.

10. The method as claimed in claim 1, wherein the step of uncovering the covering substance is by stripping a solution.

11. The method as claimed in claim 5, wherein the negative photoresist is composed of a polymer with carboxylic group, a photo-initiator and an unsaturated photo monomer.

12. The method as claimed in claim 5, wherein 0.5~3% sodium carbonate solution is used as a developing solution for the negative photoresist and 1~10% sodium hydroxide solution is used as a stripping solution.

13. The method as claimed in claim 5, wherein the positive photoresist is composed of a resin soluble in alkali and a compound containing quinonediazide.

14. The method as claimed in claim 5, wherein 0.5~3% sodium carbonate, sodium silicate, tetramethylammonia oxide solution is used as a developing solution for the positive photoresist and 1~10% sodium hydroxide solution or an organic solvent is used as a stripping solution.

15. The method as claimed in claim 7, wherein the liquid insulating layer is made of epoxy resin, bismaleimide triazine resin, polyamide resin or cyanate ester resin.

16. The method as claimed in claim 1, wherein after the step of forming the insulating layer, further include hardening and flattening.

17. The method as claimed in claim 16, wherein the hardening is done by baking or exposure.

18. The method as claimed in claim 17, wherein during the baking or exposure, the resin is cured as non-solvent, B-stage, and fully cured.

19. The method as claimed in claim 16, wherein the flattening is done by sand paper or gauze.

20. The method as claimed in claim 19, wherein the sand paper/gauze is #600, #1200 or #1600.

* * * * *